(12) United States Patent
Ma et al.

(10) Patent No.: US 8,963,644 B2
(45) Date of Patent: Feb. 24, 2015

(54) RECONFIGURABLE OUTPUT MATCHING NETWORK FOR MULTIPLE POWER MODE POWER AMPLIFIERS

(71) Applicant: Mitsubishi Electric Research Laboratories, Inc., Cambridge, MA (US)

(72) Inventors: Rui Ma, Somerville, MA (US); Sushmit Goswami, Cambridge, MA (US); Koon Hoo Teo, Lexington, MA (US); Chunjie Duan, Brookline, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 85 days.

(21) Appl. No.: 13/849,787

(22) Filed: Mar. 25, 2013

(65) Prior Publication Data

US 2014/0285264 A1 Sep. 25, 2014

(51) Int. Cl.
*H03F 3/191* (2006.01)
*H03G 3/00* (2006.01)
(Continued)

(52) U.S. Cl.
CPC .............. *H03G 3/008* (2013.01); *H03F 3/191* (2013.01); *H03F 1/0277* (2013.01); *H03F 1/565* (2013.01);
(Continued)

(58) Field of Classification Search
CPC ............. H03F 3/68; H03F 3/19; H03F 3/211; H03F 2200/537; H03F 3/193; H03F 1/0227; H03F 1/0261; H03F 2200/102; H03F 2200/541; H03F 3/21; H03F 2200/105; H03F 2200/534; H03F 3/45179; H03F 1/56; H03F 3/245; H03F 1/565; H03F 1/0205; H03F 1/303; H03F 2200/108; H03F 2200/294; H03F 2200/417; H03F 2200/451; H03F 3/189; H03F 2200/222; H03F 2200/378; H01F 38/14
USPC ............................................. 330/302; 333/32
See application file for complete search history.

(56) References Cited

U.S. PATENT DOCUMENTS 5,361,403 A  11/1994 Dent
5,423,074 A * 6/1995 Dent ............................. 330/145

(Continued)

FOREIGN PATENT DOCUMENTS

EP      2214310 A1    4/2010

OTHER PUBLICATIONS

Kenichi Horiguchi, et al., "Three-mode Stage-bypass High-efficiency Power Amplifiers for Wideband Code Division Multiple Access (W-CDMA) Applications," Mitsubishi Electric Advance Magazine, ISSN 1345-3041, Jul. 2012, vol. 138, pp. 3-4.

(Continued)

*Primary Examiner* — Khanh V Nguyen
(74) *Attorney, Agent, or Firm* — Dirk Brinkman; Gene Vinokur

(57) ABSTRACT

An impedance matching network for a radio frequency (RF) amplifier includes multiple stages connected to each other in a first to last order. A first stage produces an RF output signal, and a last stage receives an RF input signal. Each stage includes a first inductor connected to produce an output signal, a second inductor connected to receive an input signal from a next stage, a capacitor connected between the first and second inductors and a ground. In addition, each stage other than the first stage further includes a first switch to by-pass the first and second inductors, a second switch connected between the first and second inductors and the ground, and a controller for controlling, the first and second switches to select a particular power level of a set of power levels.

3 Claims, 7 Drawing Sheets

(51) Int. Cl.
*H03F 1/02* (2006.01)
*H03F 1/56* (2006.01)
*H03F 3/189* (2006.01)
*H03F 3/24* (2006.01)
*H03F 3/72* (2006.01)

(52) U.S. Cl.
CPC ............... *H03F 3/189* (2013.01); *H03F 3/245* (2013.01); *H03F 3/72* (2013.01); *H03F 2200/387* (2013.01); *H03F 2200/391* (2013.01); *H03F 2200/417* (2013.01); *H03F 2200/421* (2013.01); *H03F 2203/7215* (2013.01); *H03F 2203/7221* (2013.01); *H03F 2203/7236* (2013.01)
USPC ........................................................ 330/302

(56) References Cited

U.S. PATENT DOCUMENTS

| | | | |
|---|---|---|---|
| 5,661,434 A | 8/1997 | Brozovich | |
| 6,538,506 B2 | 3/2003 | Hareyama | |
| 6,859,104 B2 * | 2/2005 | Toncich et al. | ............... 330/302 |
| 6,900,692 B2 | 5/2005 | Kim | |
| 6,949,974 B2 | 9/2005 | Ohnishi | |
| 7,427,894 B2 | 9/2008 | Dow | |
| 7,443,236 B2 | 10/2008 | Dow | |
| 7,515,016 B2 | 4/2009 | Schenkel | |
| 7,518,446 B2 | 4/2009 | Hau | |
| 7,764,125 B2 | 7/2010 | Dawe | |
| 7,982,543 B1 | 7/2011 | Yuan | |
| 8,098,114 B2 | 1/2012 | Fukuda | |
| 8,207,798 B1 | 6/2012 | Wright | |
| 8,390,392 B2 * | 3/2013 | Nagai et al. | ..................... 333/32 |
| 2007/0194859 A1 | 8/2007 | Brobston et al. | |
| 2009/0267703 A1 | 10/2009 | May | |
| 2010/0079211 A1 * | 4/2010 | Matsuda et al. | .............. 330/306 |
| 2010/0182216 A1 | 7/2010 | Schmidhammer | |
| 2012/0188007 A1 | 7/2012 | Van Zyl | |
| 2012/0243580 A1 | 9/2012 | Wright | |

OTHER PUBLICATIONS

Douglas A. Teeter, et al., "Average Current Reduction in (W)CDMA Power Amplifiers," Proceeding of IEEE RF Integrated Circuit (RFIC) Symposium, Jun. 2006, pp. 429-432.

Gary Hau, et al., "Multi-Mode WCDMA Power Amplifier Module with Improved Low-Power Efficiency using Stage-Bypass," Proceeding of IEEE RF Integrated Circuit (RFIC) Symposium, May 2010, pp. 163-166.

* cited by examiner

300

RECONFIGURABLE OUTPUT MATCHING NETWORK FOR MULTIPLE POWER MODE POWER AMPLIFIERS

FIELD OF THE INVENTION

The present invention relates generally to an impedance matching network for power amplifiers, and more particularly to impedance matching networks for multiple power mode radio frequency power amplifiers.

BACKGROUND OF THE INVENTION

In a transmitter, a radio frequency (RF) power amplifier (PA) consumes the most energy. This is a problem for mobile devices that are battery operated, such as cellular telephones, and other wireless devices. The RF PA affects the performance in terms of efficiency, linearity, and output power. The efficiency of the PA for converting the battery power to RF power of the signal determines to a great extent the length of time the device can be used before recharging, if at all possible.

The efficiency of the PA is dependent on factors including, but not limited to, semiconductor technologies, amplifier architecture, mode of operation, and an impedance matching network. The performance of PA is also affected by manufacturing and packaging procedures. The instantaneous efficiency of the PA is closely related to the signal amplitude. It is known that the RF PA operates most efficiently when the input signal has a high power mode, which is close to the device saturated power. In general, the efficiency of the PA degrades with a decrease of the input signal power level. Consequently, the conventional PA normally operates inefficiently at a middle power mode, and very inefficiently at a low power mode, in comparison with high power mode operation.

This inefficiency is more severe in the smart phones for third and fourth generation (3G 4G) mobile communication that use a varying amplitude modulated RF signal. Spectrum-efficient modulated signal, such like Wideband Code Division Multiple Access (WCDMA), Long Term Evolution (LTE) and LTE-Advanced signals, normally have high peak-to-average power ratio (PAPR). Typically, the probability density function of those signals indicates that the highest probability happens at the average power levels, approximately 7-10 dB back-off with respect to the peak power level. This implies that the RF PA operates inefficiently most of the time under these scenarios. The output power level of the power amplifier depends also on a distance between the mobile device and a base transceiver station (BTS), the transmission environment, and impedance mismatch conditions.

Hence, the enhancement of RF power amplifier efficiency at middle and low power mode is important. There are several conventional approaches for increasing the efficiencies of power amplifiers with multiple power modes.

A Doherty amplifier improves efficiency at low and middle power modes, and is widely used for wireless communications, especially at the base station. The Doherty amplifier uses a main amplifier and an auxiliary amplifier. The operation principle of Doherty amplifier is based on a load modulation from the auxiliary amplifier to the main amplifier at different power levels. Although the Doherty amplifier is capable of offering relative high efficiency at peak power level and at average power level, it is not very suitable for mobile devices because of its large size, and inherent limited bandwidth.

Another enhancement approach is envelope tracking (ET), which dynamically adapts the supply voltage to the envelope of the input RF signal. ET is theoretically able to offer high efficiency amplification independent of power level. However, the main limitation and challenges of applying ET to mobile devices come from extra circuit modules (power modulator), and challenges of envelope signal alignment, and cost.

As shown in FIG. 1, a stage-bypass technique, which selects different branches or combinations of power amplifiers according to the actual power mode to achieve efficient operation, is also commonly used in the mobile telephones. For the high power mode, the input RF signal 101 is amplified by both PA1 110 and PA2 120 to the output RF signal 102. For the lower power mode, PA2 is bypassed and the RF signal is only amplified by PA1. The signal path is selected by the switches 115 and 125. However, disadvantages of the stage-bypass technique include the complexity due to the number of amplifiers. The design becomes more complicated for multi-band PA modules, where the PAs operate work at different frequency bands.

Load modulation is another method to improve the efficiency at low output power levels. Given that the power amplifier operation and its efficiency is significantly influenced by the load impedances for transistor at certain bias conditions, the load conditions can be dynamically adjusted according to the power modes at which the amplifier actually operate to obtain an efficient operation at different power levels.

Only one transistor is needed for the amplifier implementation. A adjustable impedance matching network for load modulation technique can be reconfigured by selecting different matching element, for example inductors, capacitors, and transmission lines, or combinations using switching elements, for example using gallium arsenide (GaAs) pseudomorphic-high electron mobility transistor (pHEMT) switcher.

Alternatively, the impedance matching network can be tuned with a varactor using control signals, such as voltage applied between two terminals, to change its reactance. However, the extra complexities, power loss, reliabilities of the switchable and/or tunable elements are a disadvantage of the load modulation approach, when the matching network is not properly designed.

Hence, there is a need for improving power amplification for multiple power mode power amplifiers, particularly in battery operated wireless devices.

SUMMARY OF THE INVENTION

It is an objective of the embodiments of the invention is to improve power efficiency of a multi power mode power amplifier (PA), especially in a back-off power region. It is a further objective of some embodiments to use a reconfigurable matching network for the multiple power mode RF power amplifiers to obtain efficient operation at different power levels.

One embodiment is a two-step reconfigurable impedance matching network with basic matching components e.g., inductors and capacitors, which transform the system characteristic impedance, normally 50Ω, to two impedance values for two power levels.

Another embodiment is a three-step reconfigurable impedance matching network, Which provides three different transformed impedances for the three power levels.

The embodiments provide a general topology of an N-step reconfigurable impedance matching network, which is capable to transformed different impedance values, for an N-power mode power amplifier.

The matching components can be in the form of lumped inductors and capacitors, but not at all limited to them. Any components having certain inductance and capacitance can be used as the matching elements. For example, the parasitic effects of bonding wires can function as inductors. The air gap between transmission lines or the open ended transmission lines effect can be treated as capacitance. Also, the components can be manufactured using different processes, such like surface mounted technology (SMT), MMIC (monolithic microwave integrated circuit), and radio frequency integrated circuit RFIC) using various semiconductor processes.

It is realized that it is advantageous to design the reconfigurable impedance matching network to minimize extra losses introduced by switching elements. The reduced number of the switching elements reduces the complexity of the amplifier circuit as well as the controlling. The efficient amplification of a power amplifier can be obtained by using the invented reconfigurable matching network at different output power levels.

DETAILED DESCRIPTION OF THE PREFERRED EMBODIMENTS

The embodiments of the invention provide an N-stage reconfigurable impedance matching network for N-different power modes.

Figure 1:
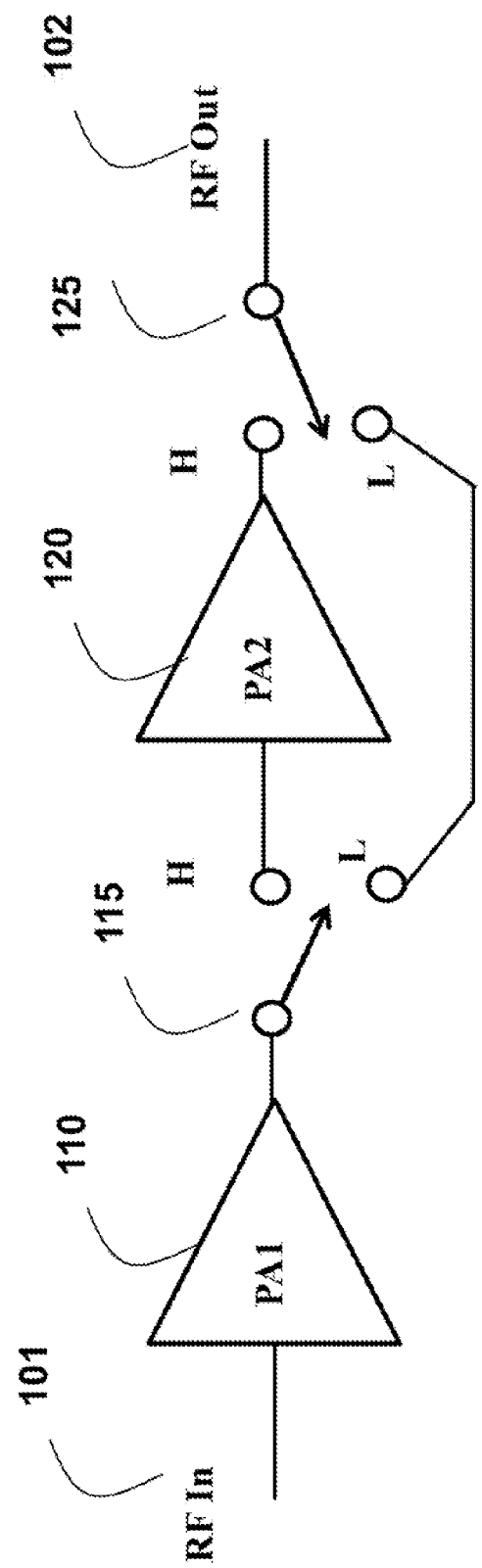
FIG. 1 is a circuit diagram of a conventional stage-bypass power amplifier for two-level power mode operation.
Figure 2:
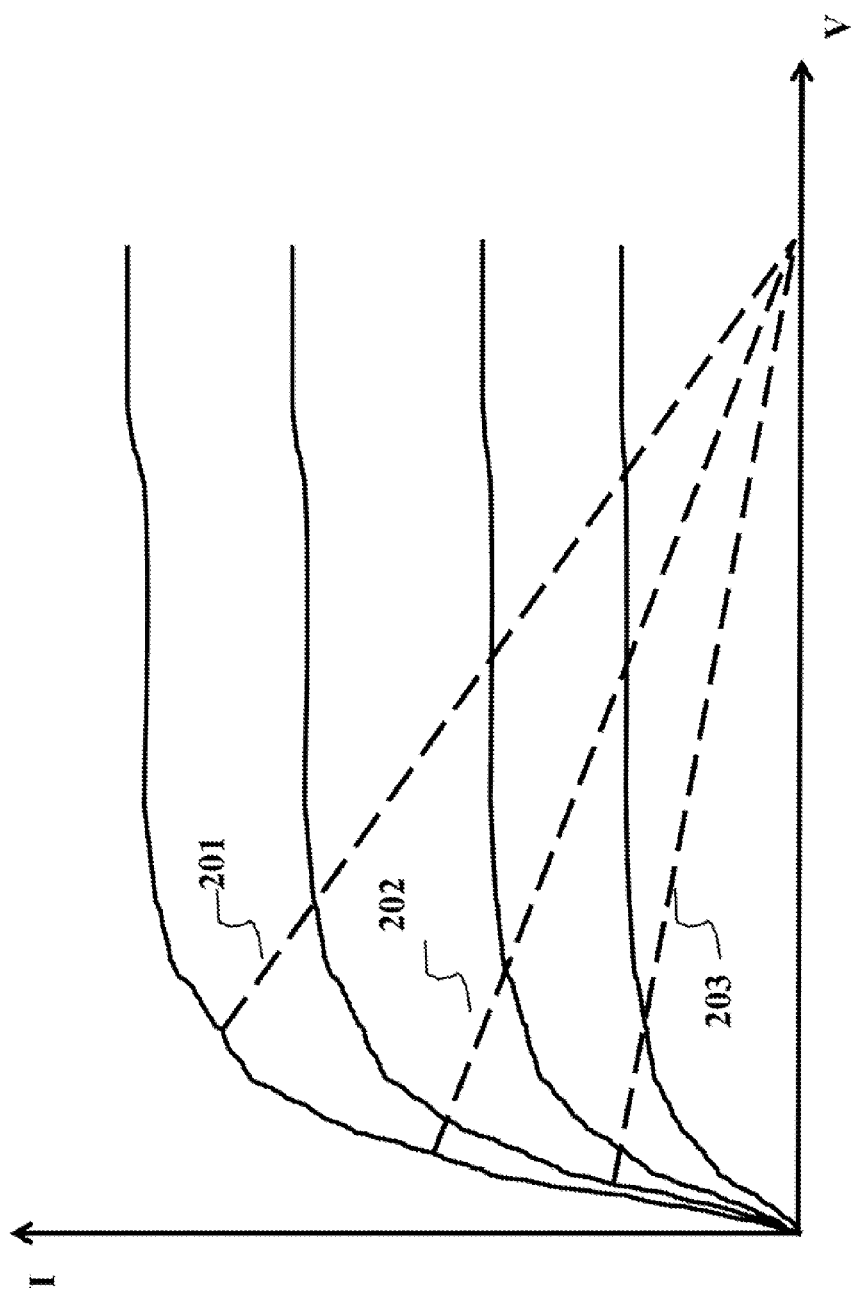
FIG. 2 is a graph of loadlines as a function of current and voltage for three different power modes used by embodiments of the invention.

FIG. 2 shows loadlines as a function of current and voltage for three different power modes used by embodiments of the invention. For middle and low power mode, the load impedance is adjusted to higher impedances. The impedance is reverse to the slope of the dashed lines. The impedance is just the resistance indicated by line 201, 202, and 203 for simplification, corresponding to the optimal load resistance required by a transistor at low, middle and high power modes, respectively.

Thus, a power amplifier (PA) operates at nearly saturated regions for different power modes with high efficiency. The advantage of the load modulation compared with the stage-bypass is a relative simpler circuitry with fewer active devices.

The loadline, simplified to pure resistance, slope $k=1/R_{opt}$ (optimal resistance) is the required impedance value for terminating the device at a fundamental frequency, under the assumption that all harmonics are shorted, and pure resistance for fundamental frequency termination for simplification. Different output power mode levels require correspondingly different $R_{opt}$ values. Therefore, by providing the corresponding impedance value by the impedance matching network, the device is saturated while delivering the required output power efficiently.

For instance, three loadlines 201, 202 and 203 show the impedance values for a device to deliver low power, middle power, and high power, respectively. It is noted that the invention can be used with any number of power modes.

Figure 3:
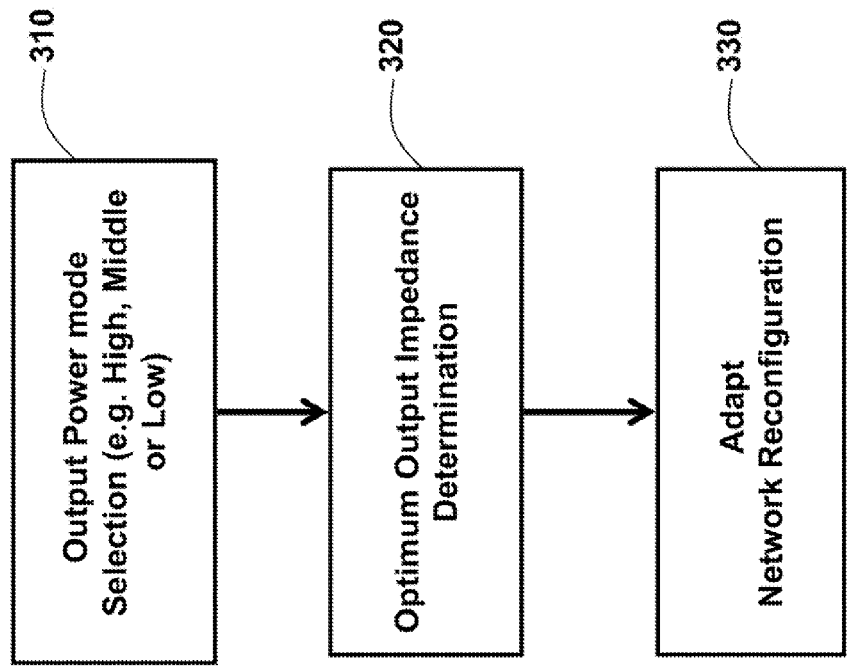
FIG. 3 is a flow chart of a control procedure for a reconfigurable matching network
operating in multiple power modes according to embodiments of the invention.

FIG. 3 shows a procedure for adjusting a reconfigurable impedance matching network for a multiple power mode power amplifier in a transceiver, e.g., a mobile telephone. Normally, the radio frequency integrated circuit (RFIC) or baseband integrated circuit (BBIC) selects 310 a power mode (high, middle, or low) for the power amplifier. An optimum impedance can be determined 320 using a look up table (LUT) and/or a feedback signal indicating the instantaneous radiated output power. Then, a status of a reconfigurable impedance matching network is adapted by switches and/or matching elements. The procedure can be performed in a processor, or microprocessor 300 having memory and input/output interfaces as known in the art.

Figure 4A:
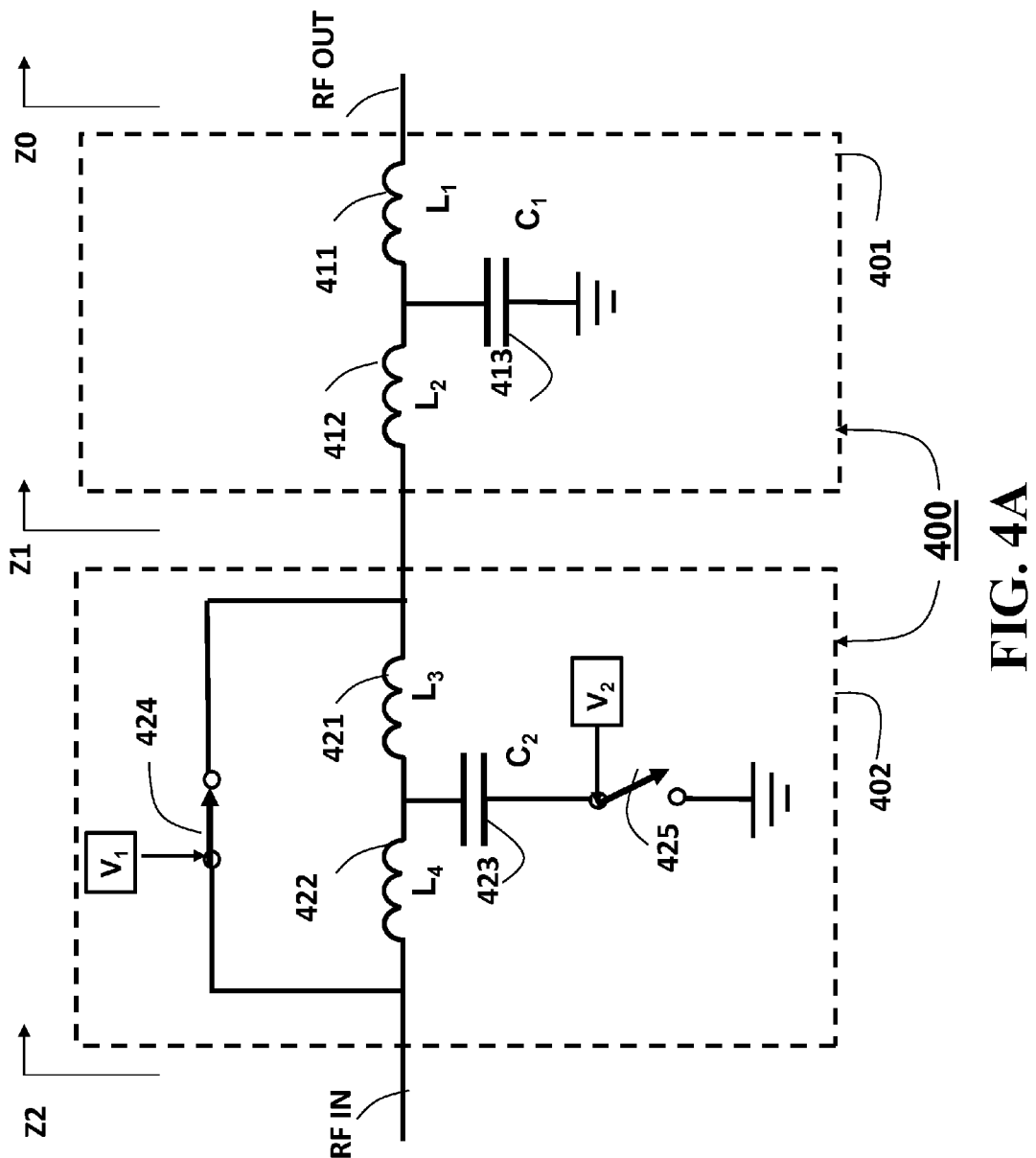
FIG. 4A is a circuit diagram of a two-stage reconfigurable impedance matching network: at one status according to embodiments of the invention.

FIG. 4A shows one embodiment of the invention 400, i.e., a multi-stage reconfigurable impedance matching network with a first stage is 401 and a second stage 402 for impedance matching. In the figures, impedances are shown as $Z_N$.

The first stage 401 includes serially connected inductor (L) 411-412, and a capacitor (C) 413 between the inductors connected to ground. The RF output is usually a 50Ω transmission line. The first inductor 412 is connected to the output of the second stage, which includes inductors 421-422 and capacitor 423, this time connected to ground by a switch 425. The inductor 422 receives the RF input. There is also a by-pass switch 424 for inductors 421-422.

The first stage 401 transforms the system impedance (normally 50Ω) to the impedance Z1. Z1 can be, for example, the required optimal impedance in the low power mode. Switch 424 is ON, and 425 is OFF. If the RF input signal flows through switch 424, then the second stage 402 is bypassed. In this case, there is no impedance matching performed by the second stage 402, and the configuration corresponds to the low power mode. FIG. 4A also shows the means $V_1$ and $V_2$ for controlling $V_1$ the switches 424 and 425.

Figure 4B:
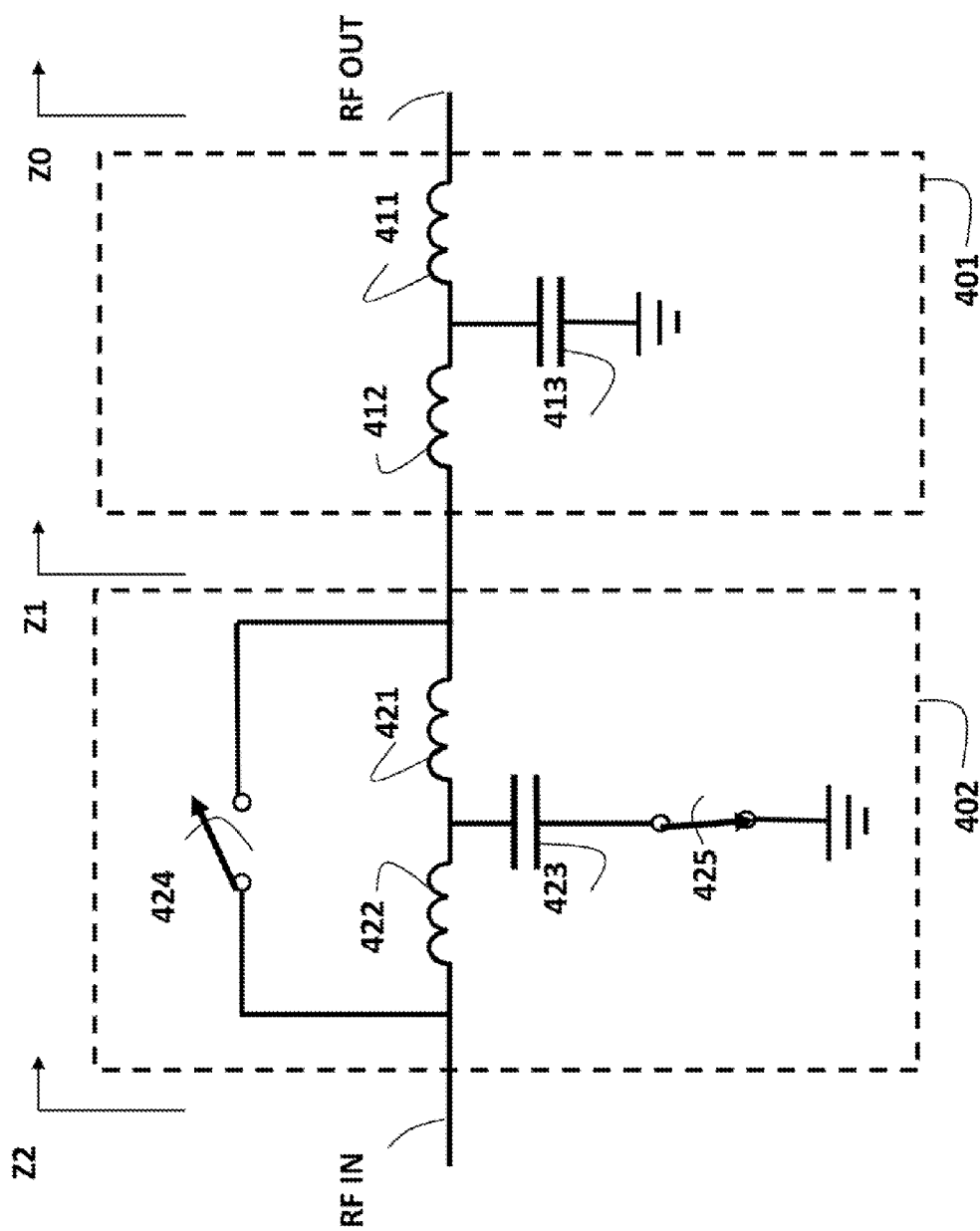
FIG. 4B is a circuit diagram of the embodiment mentioned in FIG. 4A re configured to another status according to embodiments of the invention.

In the configuration of FIG. 413, switch 424 is OFF and switch 425 is ON. This corresponds to the high power mode with a lower impedance. Thus, the configuration in FIGS. 4A and 4B correspond to a two-stage power matching network operating in either an efficient low mode PA or an efficient high power mode PA. As an advantage of this embodiment, with the series switch ON in the high power mode minimizes switch introduced insertion loss. Switch 425 does not need to block a high voltage, which makes this embodiment suitable for high power application.

Figure 5:
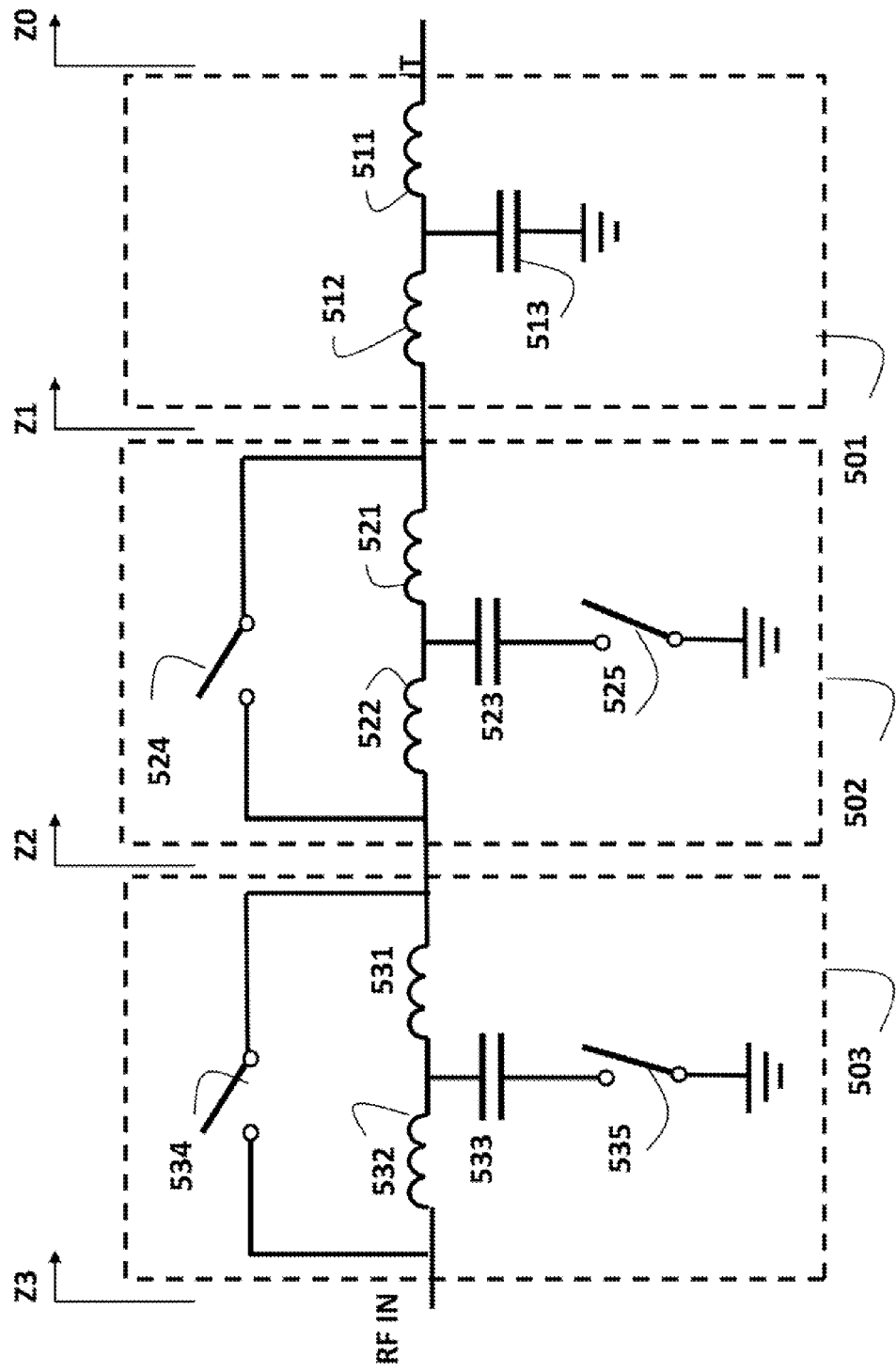
FIG. 5 is a circuit diagram of a three-stage reconfigurable impedance matching network for three different power modes operation according to embodiments of the invention.

FIG. 5 shows another embodiment. The first stage is similar to the first stage in FIG. 4A with inductors 511-512 and capacitor 513. Each subsequent stage is similar to the second stage in FIG. 4A with inductors 521-522, 521-532, and capacitors 523 and 533, and by-pass switches 524, 534, and grounding switches 525 and 535.

It can be seen that it is a further development based on the embodiment 400. Another matching stage 503 is added together with 501 and 502. The stage 501 and 502 can be considered performing the similar functionalities like the one just described by impedance matching stage 401 and 402.

This configuration supports three power levels, by appropriately selecting the ON OFF positions of the switches.

Figure 6:
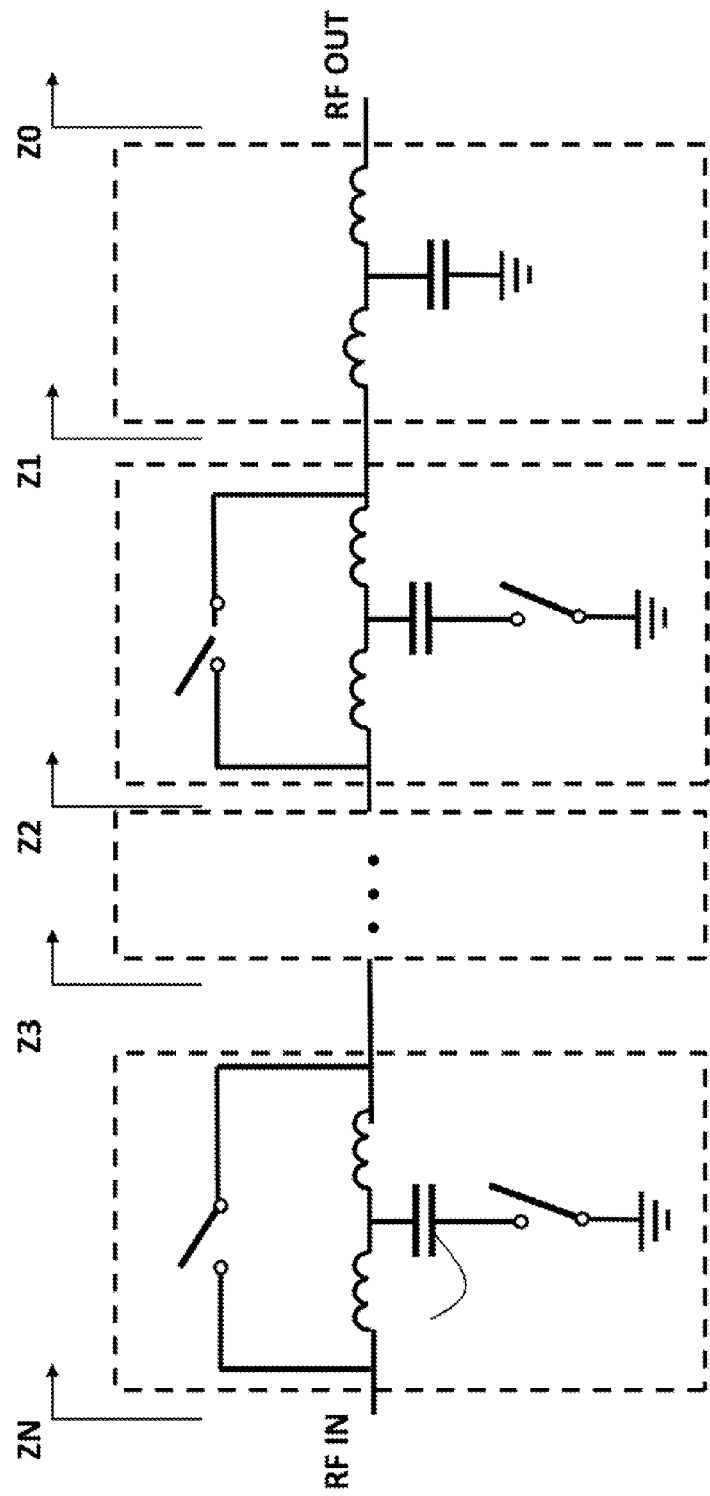
FIG. 6 is a circuit diagram of a generalized N-stage reconfigurable impedance matching network for N-different power modes operations according to embodiments of the invention.

FIG. 6 shows a generalized topology for an N-stage matching reconfigurable matching network according to embodiments of the invention. The first stage is similar to the first stage and the subsequent stages are similar to the second stage of FIG. 4A. The possible N-power mode levels increase as a result of the transformed impedance $Z_N<Z_{N-1}< \ldots <Z_2<Z_1<Z_0=50\Omega$ (no reactive part for simplification).

It should be made clear that the L, C element can be, but are not limited to, the form of discrete L, C chips, and also transmission lines, bond wires, gaps. Basically, any kind of element that behaves inductively can be used to implement the L function in the network; similarly, any kind of elements that behaves capacitively can be used to implement the C function in the network.

As described, herein, the stages are arranged in a first to last order, wherein the first stage is closest, to the output signal, and the last stage is closets to the input signal.

In addition, note that, for simplification in FIG. 2, the optimal impedances for different power levels is expressed as the corresponding optimal resistances. In a practical application, the matching normally is meant to match to a complex impedance Z, not the pure resistance R, because of the parasitic effects of the device and packing. However, by selecting appropriate values for the inductors L and capacitors C, one can achieve $R_1$ and $R_2$, and $Z_1$ and $Z_2$. For example, starting with a 50Ω system impedance, $R_1=16\Omega$, and $R_2=4\Omega$ are matched in first and second stages by selecting the $L_1, L_2, C_1$ in the first stage, $L_3, L_4$, and $C_2$ in the second stage for low power and high power modes. By selecting different values of L and C, one can also obtain $Z_1$ and $Z_2$, both having reactive parts, when the optimal complex impedance desired.

For most transistor used for designing PA for mobile telephones, the optimum resistance is less than 50Ω ($R_n<R_{n-1}<, \ldots R_1<Z_0=50\Omega$). However, in the case, when $R_n>R_{n-1}, \ldots, >Z_0=50\Omega$, for example, the optimal resistance for high mode 100Ω, and low mode 200Ω is also achievable. In this case, the second inductors, 412 and 422 are not needed, and shunting switch can work as described above to turn on the second stage ON or OFF.

In general, for matching to optimum resistance greater than the system impedance ($R_{opt}>Z_0=50\Omega$), the matching stage simplifies to series L and shunt C, i.e., a lowpass structure, by omitting the second series inductor, as explained before (remove 412 and 422, respectively). Also, the difference between the optimum impedance and the optimum resistance is not an issue, the reactive part can be matched by selecting the proper L and C values. This can be designed by an experienced person understanding the impedance matching art In it summary, by properly selecting the L, C values to be any value equally or greater zero, one can match the system impedance, to an optimal impedance at different power modes.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. An apparatus for matching impedances in a radio frequency (RF) amplifier, comprising:
   a plurality of stages, wherein the plurality of stages are serially connected to each other in a first to last order, and a first stage produces an RF output signal, and a last stage receives an RF input signal, wherein the each stage further comprises:
   a first inductor connected to produce an output signal;
   a second inductor connected to receive an input signal from a next stage;
   a capacitor connected between the first and second inductors and a ground, and wherein each stage other than the first stage further comprises:
   a first switch to by-pass the first and second inductors;
   a second switch connected between the first and second inductors and the ground; and
   means for controlling the first and second switches to select a particular power level of a set of power levels.

2. The apparatus of claim 1, wherein the apparatus is installed in a wireless communication device.

3. The apparatus of claim 2, wherein the wireless communication device is a cellular network.

* * * * *